United States Patent [19]
Schnaible et al.

[11] Patent Number: 5,282,266
[45] Date of Patent: Jan. 25, 1994

[54] ICONIC METHOD OF SHOWING PROGRESS TOWARD AN OSCILLOSCOPE'S TARGET NUMBER OF WAVEFORM AVERAGES

[75] Inventors: Mark P. Schnaible; Daniel P. Timm, both of Colorado Springs, Colo.

[73] Assignee: Hewlett-Packard Company, Palo Alto, Calif.

[21] Appl. No.: 648,706

[22] Filed: Jan. 31, 1991

[51] Int. Cl.$^5$ .............................................. G06F 15/62
[52] U.S. Cl. .................................. 395/128; 395/161; 395/118
[58] Field of Search ................... 395/118–121, 395/128–132, 161; 340/722, , 743, 754

[56] References Cited

U.S. PATENT DOCUMENTS

| | | | |
|---|---|---|---|
| 4,303,973 | 12/1981 | Williamson, Jr. et al. | 340/722 X |
| 4,625,086 | 11/1986 | Karino | 340/722 X |
| 4,628,444 | 12/1986 | Nozawa et al. | 340/722 X |
| 4,868,496 | 9/1989 | Havel | 340/754 X |
| 4,944,034 | 7/1990 | Oshawa | 395/119 |
| 4,974,173 | 11/1990 | Stefik et al. | 364/521 |
| 5,128,609 | 7/1992 | Howley | 340/743 X |

FOREIGN PATENT DOCUMENTS

0394160 2/1990 European Pat. Off. ........ G06F 9/46

OTHER PUBLICATIONS

Digitizing Oscilloscope Model HP 54120T Technical Data Jul. 1987, Hewlett-Packard, U.S., p. 7.
Schlater, R. T., "Waveform Graphics for a 1-GHz Digitizing Oscilloscope", *Hewlett-Packard Journal*, vol. 37, No. 4, Apr. 1986, pp. 20-25.
Andrews, G., "Understanding Digital Storage Oscilloscopes", *Electronic Design*, vol. 36, No. 21, Sep. 1988, pp. 135-140.

Primary Examiner—Gary V. Harkcom
Assistant Examiner—Almis Jankus

[57] ABSTRACT

A system that uses two character positions on a display area of an oscilloscope to indicate the progress being made toward achieving a target number of waveform acquisitions. The system displays the percentage of waveform acquisitions taken within this two character percentage display area by first displaying two symbols as white dots on a dark background. As the percentage of waveform acquisitions taken increases, the dots within the symbols are inverted starting at the bottom of the display area and progressing toward the top. When the target number of waveform acquisitions have been taken, all the dots within the symbols are inverted to display dark on white. As the percentage increases, the dots forming the first character of the display are inverted prior to the dots forming the second character. Therefore, higher resolution of the display is obtained.

12 Claims, 10 Drawing Sheets

PRIOR ART

FIG. 1

PRIOR ART

ICONIC METHOD OF SHOWING PROGRESS TOWARD AN OSCILLOSCOPE'S TARGET NUMBER OF WAVEFORM AVERAGES

FIELD OF THE INVENTION

This invention relates to electronic test instruments and more particularly to oscilloscopes. Even more particularly, the invention relates to a method for easily displaying information on the CRT screen of an oscilloscope.

BACKGROUND OF THE INVENTION

Signal averaging is often used in oscilloscopes to reduce the effects of random noise on the input signal. This is done by acquiring the signal several times, averaging the acquired data, and displaying the average. The amount of noise reduction is determined by the number of acquisitions of the input signal that are averaged. That is, as more acquisitions are taken of the input signal and these acquisitions averaged, more noise will be reduced by the averaging process and therefore not be visible on a display of the averaged signal. Prior art oscilloscopes that average the input signal over time often do not graphically indicate their progress toward a target average count. That is, a user of the oscilloscope must know the number of acquisitions the user has requested, the number of the current acquisition being taken, and perform a calculation to derive the progress that is currently being made toward the target number of acquisitions that will be averaged.

One prior art method of displaying the information needed to make this calculation is to display, on one line of the CRT display screen, the current acquisition number being taken and the maximum number of acquisitions that will be taken. This method suffers from two disadvantages, 1) the user must perform a mental calculation to determine the progress, and 2) and entire line of information is used on the screen, thus taking up valuable screen display space.

A second method used in prior art oscilloscopes is to display the current acquisition number on the screen along with the waveform, but to make the target number of acquisitions to be taken available only through a pull down or pop up menu. This method forces the user of the oscilloscope to remember the target number of acquisitions while performing the calculation to determine progress. Furthermore, when the pull down menu is being used, a significant portion of the screen is occupied by the menu.

There is need in the art then for a system to conveniently display the progress being made toward the target number of acquisitions to be averaged. There is a further need for this display method to occupy a minimal portion of the CRT screen display area. Still another need is for the display to provide a visual indication of the percentage of completion toward the target number of acquisitions. The present invention satisfies these needs.

SUMMARY OF THE INVENTION

It is an aspect of the present invention to provide a visual display of progress toward an oscilloscope's target number of waveform acquisitions to average.

It is another aspect of the present invention to provide such a visual display that occupies only one or two characters on the display surface.

Yet another aspect is to display, within this two character area, the percentage of waveform acquisitions that have been taken.

A still further aspect of the invention is to utilize both characters within the display area to increase the resolution of the percentage displayed.

The above and other aspects of the present invention are accomplished in a system that uses two character positions on a CRT display area of an oscilloscope to indicate the progress being made toward a target number of waveform acquisitions to average. The system displays the percentage of acquisitions taken within this two character percentage display area by first displaying the characters "AV", using a dot matrix format, as white characters on a dark background. As the percentage of acquisitions taken increases, the dots within the two characters are inverted starting at the bottom of the display area and progressing toward the top. When the target number of acquisitions have been taken, all the dots within the characters are inverted to display dark on white. Although the oscilloscope continues to acquire, average and display waveforms, the percentage display area is no longer changed after the target number is reached.

As the percentage increases, the dots forming the left character of the display are inverted prior to the dots forming the right character. Therefore, higher resolution of the display is obtained since each dot row being inverted is visible to the user.

BRIEF DESCRIPTION OF THE DRAWINGS

The above and other objects, features, and advantages of the invention will be better understood by reading the following more particular description of the invention, presented in conjunction with the following drawings, wherein.

DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
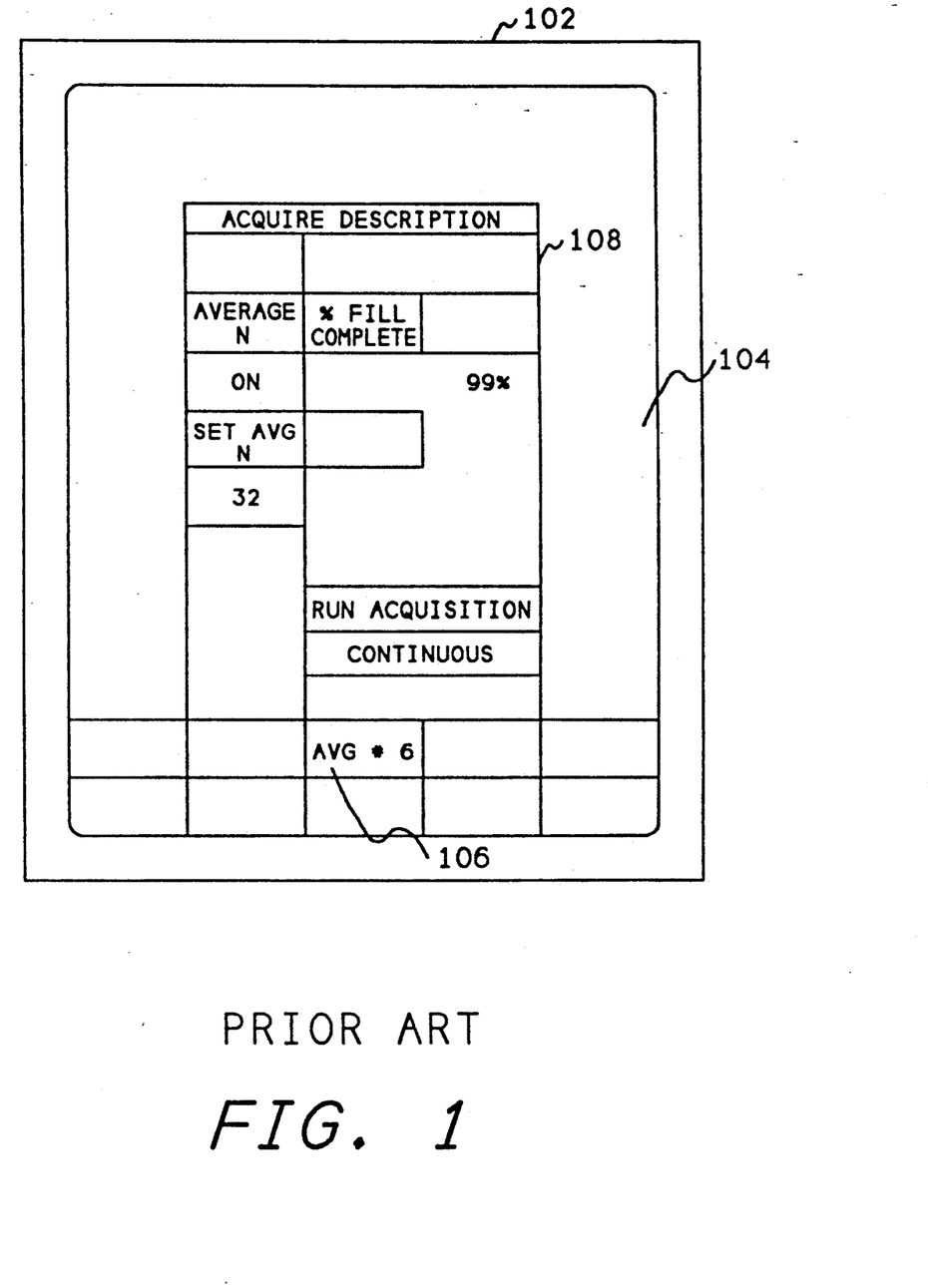
FIG. 1 shows a first prior art method of displaying the number of waveform acquisitions.

FIG. 1 shows a first prior art method of displaying the number of waveform acquisitions being averaged. Referring now to FIG. 1, an oscilloscope 102 contains a display area 104 which is a touch screen. Within the display area 104, areas are defined which cause certain submenus to "pop up." Area 106 of the display 104 shows the current acquisition number being taken and when the area 106 is touched, a submenu 108 pops up in the middle of the screen to indicate the target number of acquisitions that will be taken. This method is suboptimal in three ways. First, the area 106 that displays the acquisition number being taken must occupy a large enough area of the screen to allow a user's finger to touch it without touching adjacent areas. Secondly, when the area 106 is touched, a very large submenu 108 pops up. This submenu 108 occupies 40% to 80% of the screen area, and obliterates the signal being displayed while the submenu is present. Although the waveform display returns when the submenu 108 is removed, the waveform and the submenu cannot be visible simultaneously. A third disadvantage of this method is that the user still must mentally compute the percentage of acquisitions that have been taken. That is, although the display indicates the current acquisition number and the target number of acquisitions that will be taken, it does not indicate the percentage of completion.

Figure 2:
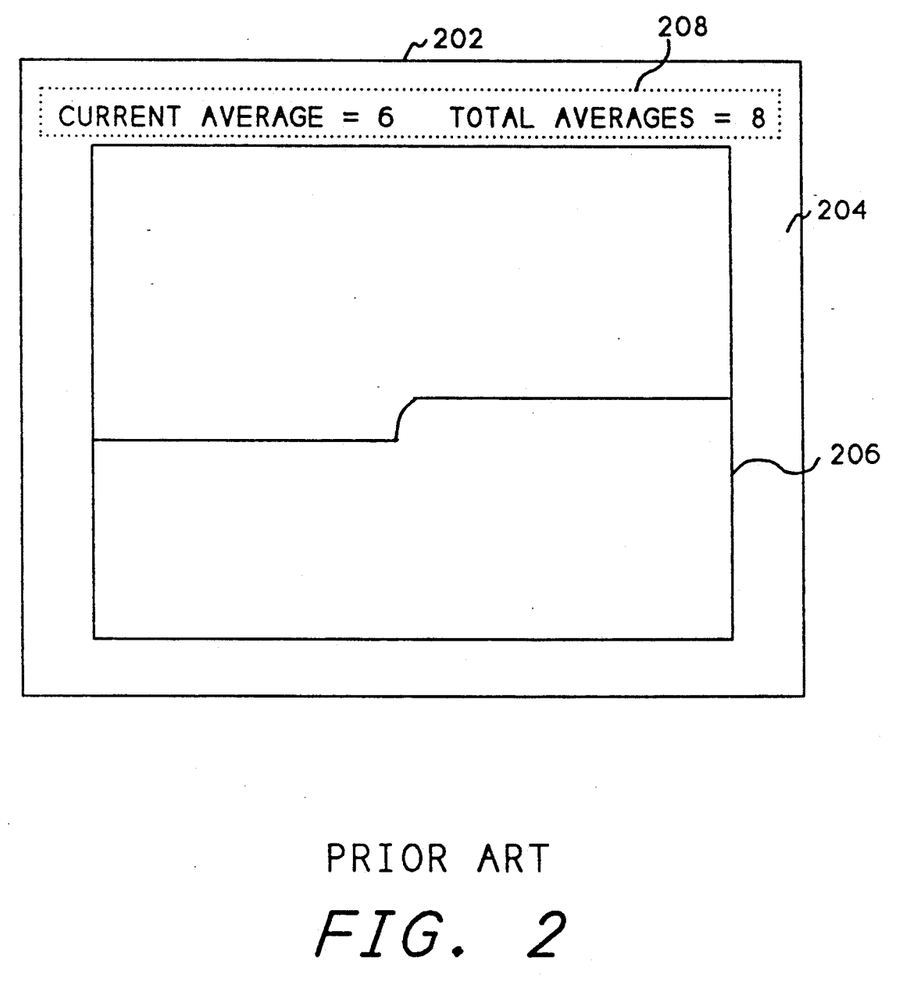
FIG. 2 shows a second prior art method of displaying the number of waveform acquisitions.

FIG. 2 shows a second prior art method of displaying the number of waveform acquisitions. Referring now to FIG. 2, an oscilloscope display 202 contains a signal display area 206. Within the display area 202, the signal display area 206 is surrounded by a border area 204. Within the border area 204, a line of information, here surrounded by dashed line 208, gives the current acquisition number being taken, and the target number of acquisitions that will be taken. This method suffers most of the disadvantages of the method of FIG. 1. Firstly, the line of information 208 takes up a significant portion of the display area 204. Secondly, the user must mentally compute the percentage of completion. Although the line of information 208 provides all the information to perform this calculation, the user is not given a direct visual presentation of the percentage of completion.

Figure 3:
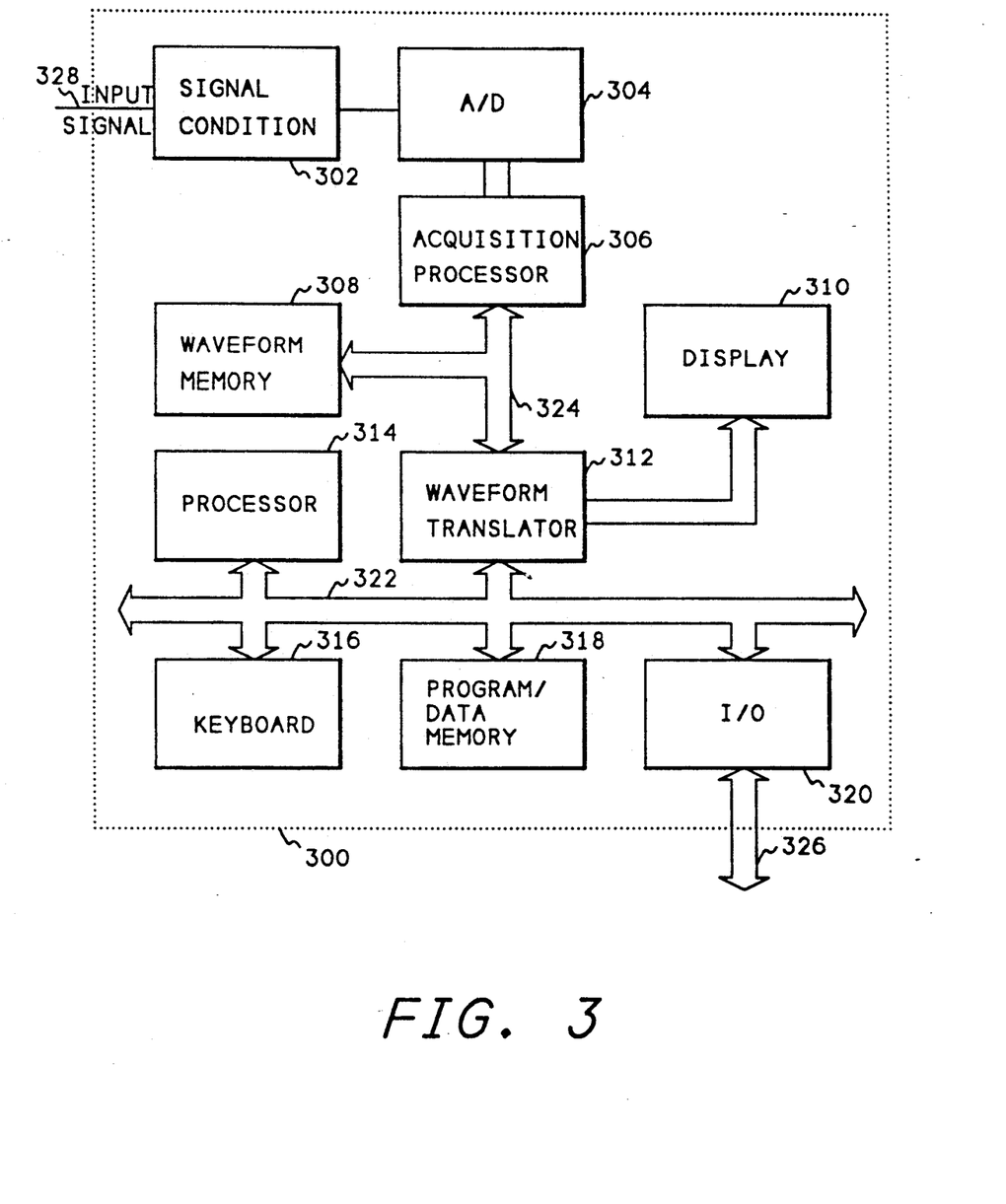
FIG. 3 shows a block diagram of an oscilloscope that incorporates the present invention.

FIG. 3 shows a block diagram of an oscilloscope that incorporates the present invention. Referring now to FIG. 3, an oscilloscope 300 receives an input signal 328 into a signal conditioning circuit 302. The output of the signal conditioning circuit 302 is connected to an analog to digital converter circuit 304. The analog to digital converter circuit 304 converts the input signal received on input 328 into a digital value and sends this digital value to an acquisition processor 306. The acquisition processor 306 collects the digital input data and stores this data over a bus 324 into a waveform memory 308. A waveform translator circuit 312 retrieves the data from the waveform memory 308, processes it, and displays it on a display 310.

The oscilloscope 300 also contains a general purpose processor 314 which connects to other elements of the oscilloscope over a bus 322. A keyboard 316 is used by the user of the system to input requirements to the oscilloscope 300. Programs and data are stored in a memory 318. The oscilloscope 300 can communicate with other instruments over an external bus 326 which is controlled by an input/output section 320. The processor 314 performs all interaction with the user of the oscilloscope, and also displays all information in the border area on the display that surrounds the signal display area. The method of the present invention is incorporated into the program memory 318, and uses the processor 314 to perform its functions.

Figure 4:
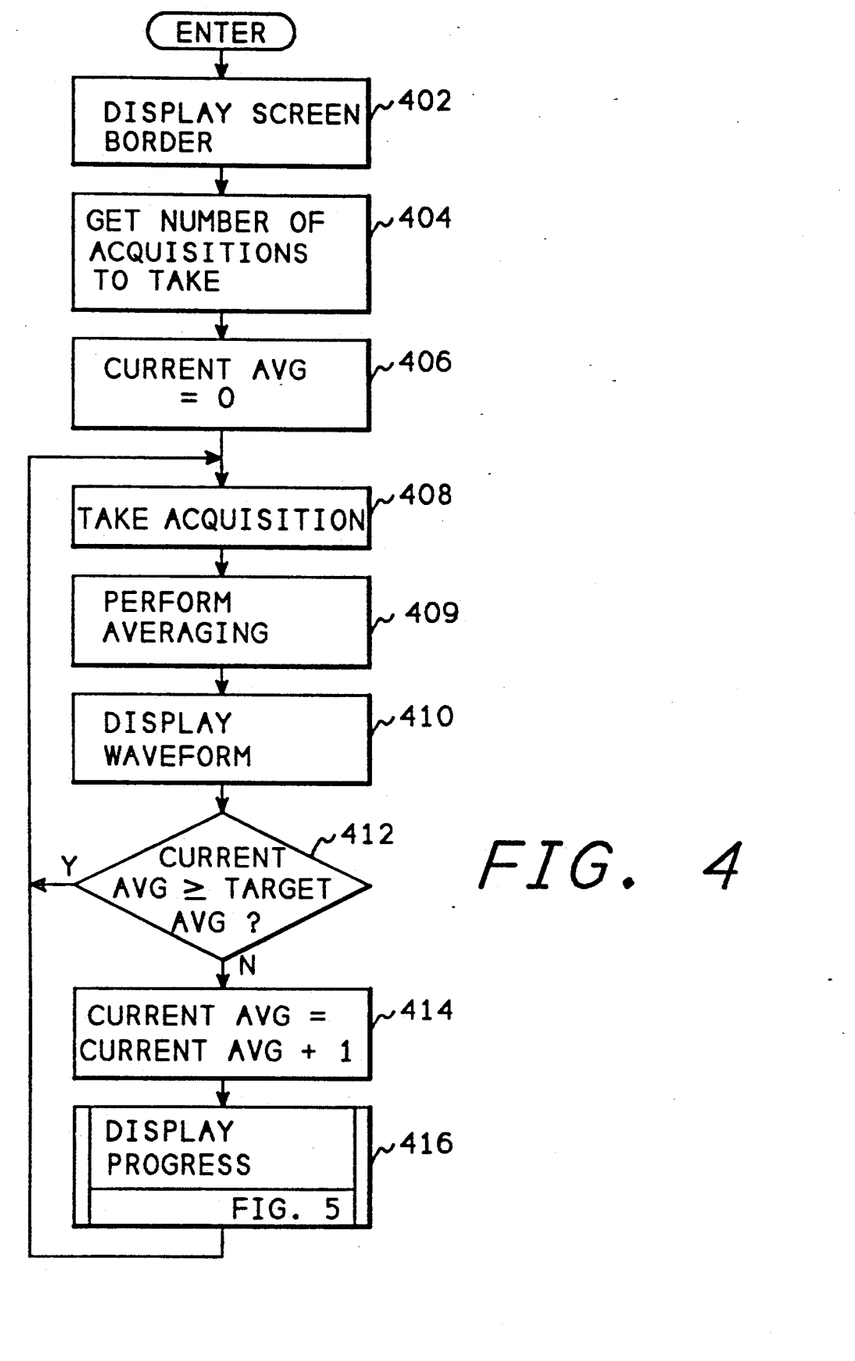
FIGS. 4 and 5 show a flowchart of the progress display method of the present invention.
Figure 5:
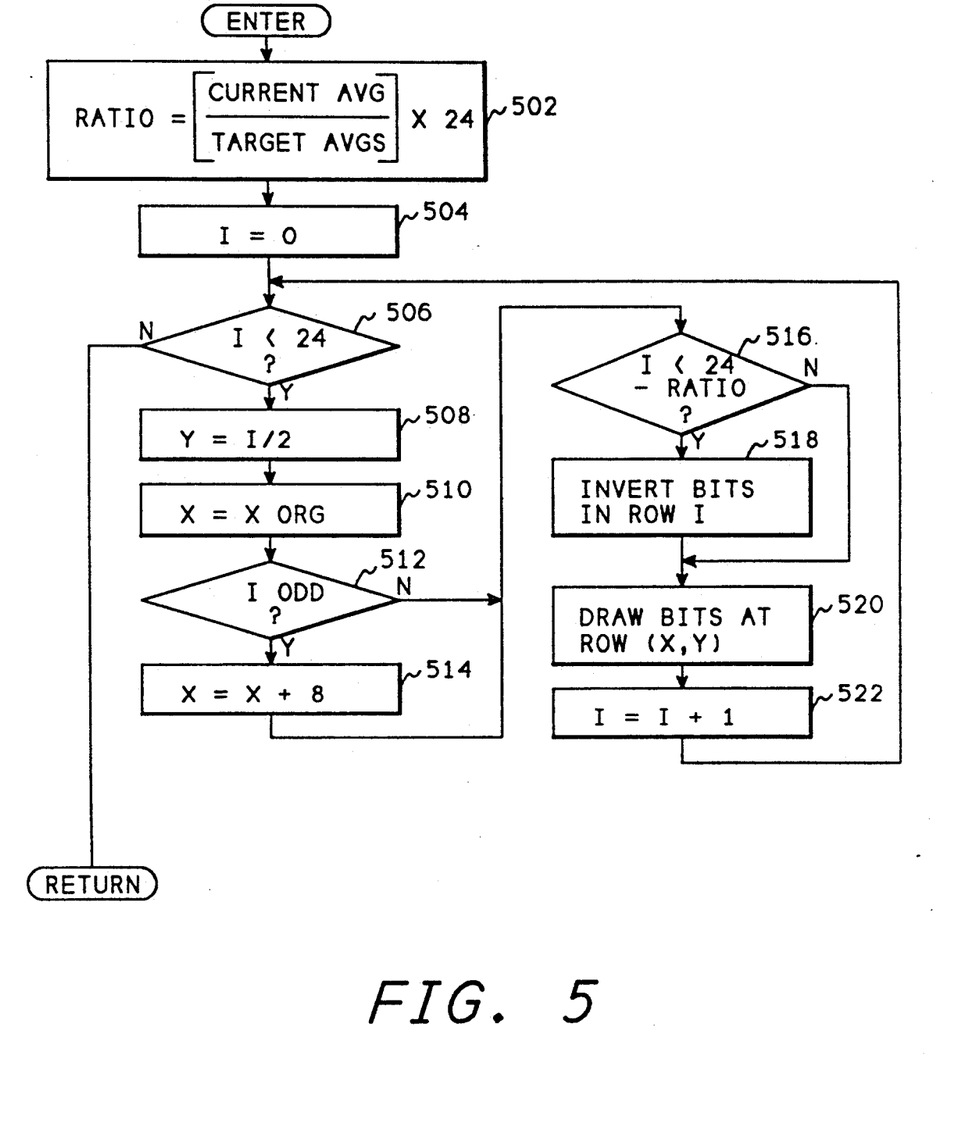

FIGS. 4 and 5 show a flow chart of the acquisition and progress display method of the present invention. The process of FIGS. 4 and 5 is called by other software within the program memory 318 (FIG. 3) to take acquisitions of the input waveform and to display the averaging information. Referring now to FIG. 4, after entry, block 402 displays the screen border around the signal display area on the display 310 (FIG. 3) of the oscilloscope. Block 404 then gets the number of acquisitions that the user has requested that the oscilloscope take. This number is the total (target) number of acquisitions that will be taken to compute the average of the waveform that will be displayed. After the target number of acquisitions have been averaged, the oscilloscope will continue to take acquisitions from the input, however, it will only average the last "target number" of acquisitions indicated by the number retrieved in block 404. In other embodiments, the oscilloscope will continue to average all acquisitions taken after the target is reached.

Block 406 sets a variable CURRENT AVG to zero. Block 408 then takes an acquisition by activating the signal conditioning circuit 302 (FIG. 3), the A to D convertor 304, and the acquisition processor 306. After, the acquisition is taken by this other circuitry, block 409 instructs the processor 314 to average the waveform, and block 410 instructs the waveform translator 312 to display the waveform. Block 412 then determines whether the CURRENT AVG is greater than or equal to the TARGET AVG. That is, has the oscilloscope taken as many acquisitions as the user requested. If the oscilloscope has already acquired the number of waveforms requested, the percentage display area on the screen will not be updated. Once the target number of acquisitions has been taken, the percentage display area has been completely updated and will remain unchanged. Therefore, if CURRENT AVG is greater than or equal to TARGET AVG, block 412 transfers back to block 408 to take another acquisition.

If CURRENT AVG is less than TARGET AVG, block 412 transfers to block 414 which increments the value of the variable CURRENT AVG, and then block 416 calls FIG. 5 to display the progress being made toward TARGET AVG. After FIG. 5 computes and displays the percentage, block 416 transfers back to block 408 to take another acquisition. This loop continues until CURRENT AVG becomes equal to TARGET AVG, at which time FIG. 5 ceases to be called until the user resets the oscilloscope or requests a different number of target acquisitions.

FIG. 5 performs the method of the present invention to compute the percentage and display it in the percentage display area on the oscilloscope's screen. After being called by FIG. 4, block 502 computes the value of a variable RATIO by dividing the variable CURRENT AVG by the variable TARGET AVG and multiplying the result by 24. In the preferred embodiment of the invention, the percentage display area on the screen contains 24 dot rows of information. The percentage display area contains two characters, each of which is formed in a 12 by 8 dot matrix. Since each character is 12 dots high by 8 dots wide, two characters represent 24 dot rows of 8 dots each. Therefore, block 502 computes a ratio display line below which the dots forming the characters within the percentage display area will be inverted. After computing RATIO, block 502 transfers to block 504 which sets the value of a variable I to 0. Block 506 then determines if I is less than 24 and if it is, transfers to block 508 which computes the Y position of the row to be displayed. Since there are two characters within the percentage display area, the variable Y will indicate the vertical dot row for both characters. Block 510 then sets the X display location for the percentage display area to the X origin of the characters on the screen.

Block 512 determines whether the variable I is an odd number. This determination is made in order to provide more resolution within the percentage display area by displaying the dot rows independently on each character. This method could be made more general and extended to a percentage display area containing several characters by dividing the variable I by the number of characters within the percentage display area. In the preferred embodiment, however, since only two characters are used, a test of even or odd is sufficient. If I is an odd number, block 512 transfers to block 514 which adjusts the X origin value by 8 dot positions to indicate the right-most character within the percentage display area. If I is even, or after adjusting the X origin, control transfers to block 516 which determines whether the variable I is less than 24 minus the ratio calculated in block 502. If I is less than 24 minus the ratio, then the dot row being displayed is below the ratio display line, therefore, block 516 transfers to block 518 which inverts the bits within this dot row. If I is greater than 24 minus the ratio, or after inverting the bits, block 508 draws the bits for this row on the display screen. Block 522 then increments the value of I and transfers back to block 506. After all dot rows have been displayed, block 506 returns to FIG. 4.

Figure 6A:
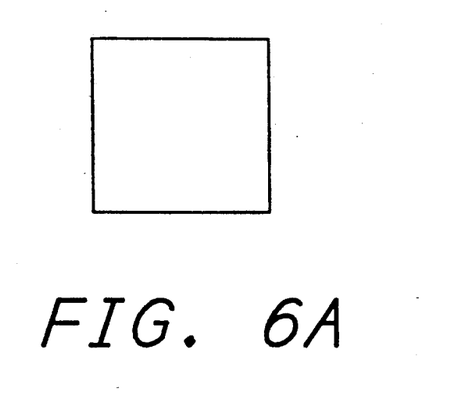
FIGS. 6A through 6E show displays that result from one embodiment of the present invention.
Figure 6B:
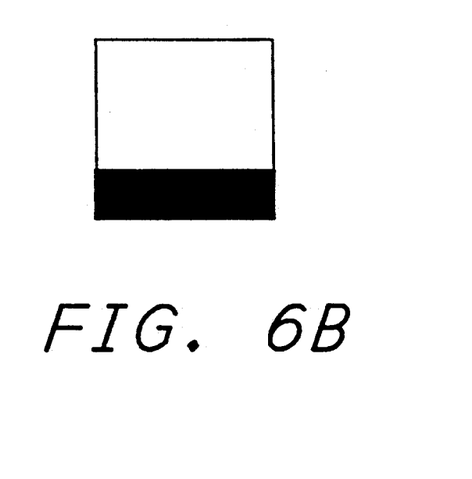
Figure 6C:
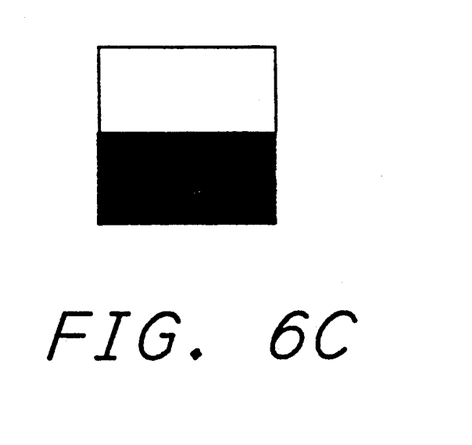
Figure 6D:
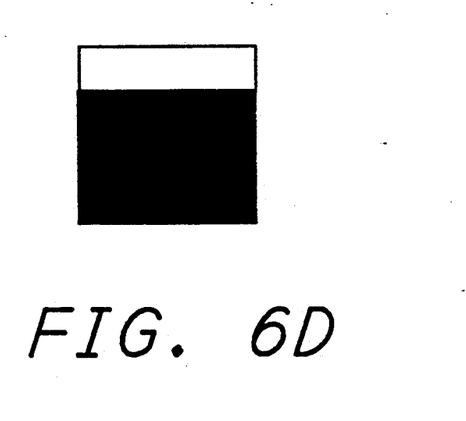
Figure 6E:
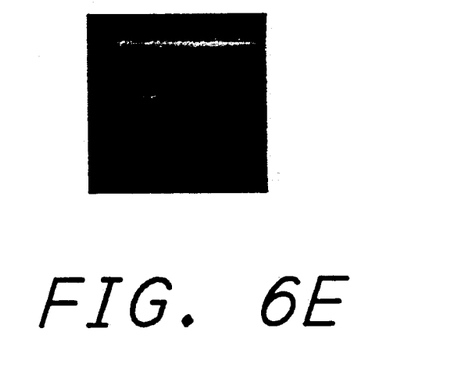

FIGS. 6A through 6E show displays that result from one embodiment of the present invention. Referring now to FIGS. 6A through 6E, FIG. 6A shows the percentage display area 602 before any acquisitions have been taken. FIG. 6B shows the percentage display area after approximately 25% of the acquisitions have been taken. FIG. 6C shows the percentage display area after approximately 50% of the acquisitions have been taken, and FIG. 6D shows the percentage display are after approximately 75% of the acquisitions have been taken. FIG. 6E shows the display area after 100% of the target number of acquisitions have been taken. The percentage display area continues to be displayed in the form of FIG. 6E as additional acquisitions are taken beyond the target number requested by the user.

Figure 7:
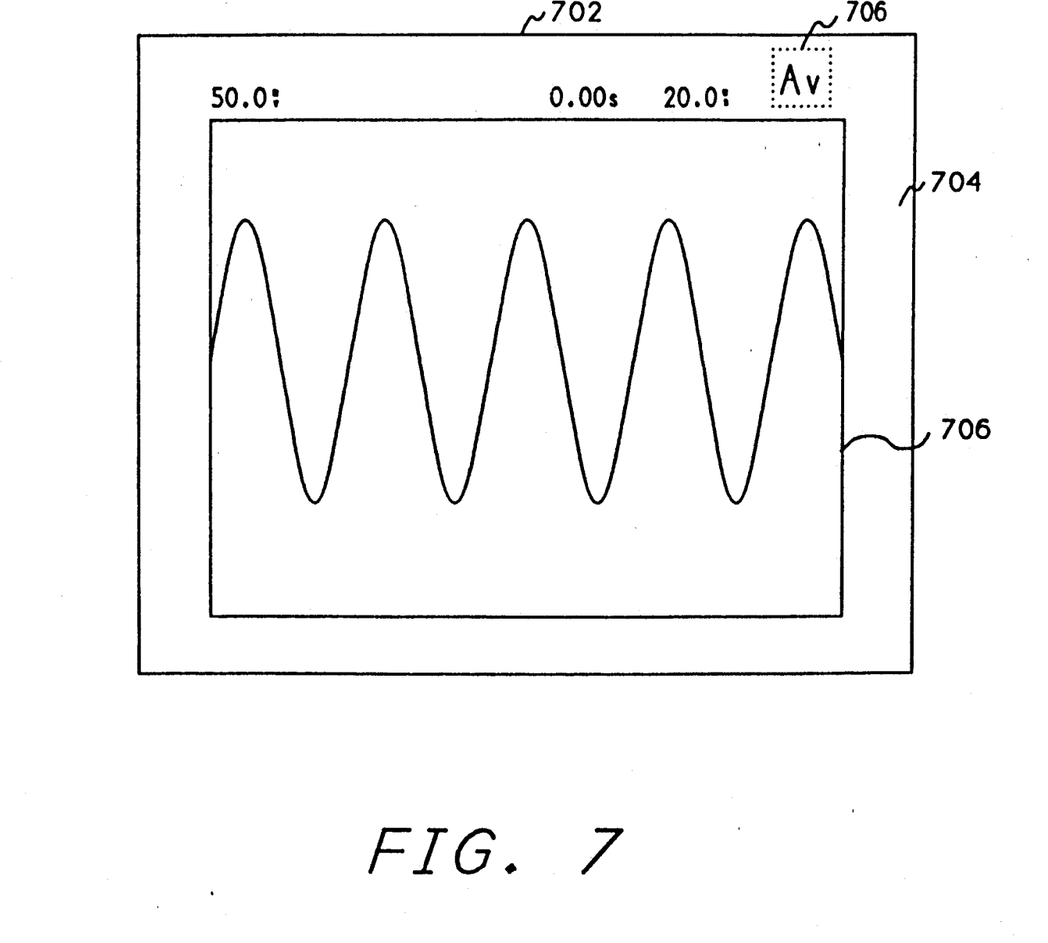
FIG. 7 shows an oscilloscope screen incorporating the preferred embodiment of the present invention.

FIG. 7 shows an oscilloscope screen incorporating the preferred embodiment of the present invention. Referring now to FIG. 7, an oscilloscope screen 702 contains a signal display area 703 and border display area 704. The percentage display area 706 of the present invention is incorporated within the border display area 704. Since the percentage display area of the present invention occupies only two character positions on the display 702, it clearly overcomes one of the limitations of the prior art by significantly reducing the amount of display area used to display the percentage of completion.

Figure 8A:
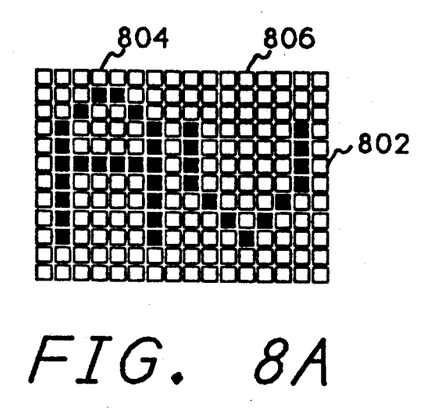
FIGS. 8A through 8E show a detailed display that results from the preferred embodiment of the present invention.
Figure 8B:
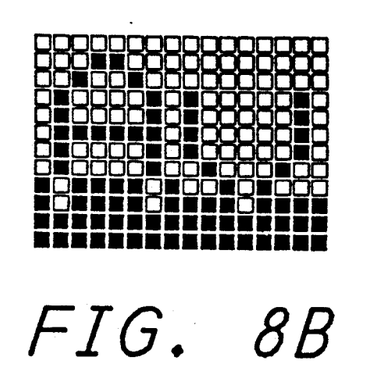

FIGS. 8A through 8E show details of the displays of the preferred embodiment of the present invention. Referring now to FIGS. 8A through 8E, a percentage display area 802 contains two characters 804 and 806 each formed using a 12 by 8 dot matrix. FIG. 8A shows the percentage display area as it would exist before any acquisitions have been taken, therefore, the percentage of completion is 0%. FIG. 8B shows the percentage display area after approximately 29% of the acquisitions have been taken. Note that the first three dot rows on both characters of the display have been inverted, and the fourth dot row on the left character of the display has also been inverted. The percentage of completion is indicated within the percentage display area by the number of dot rows that have been inverted. By inverting the dot rows on the left character before the dot rows on the right character within the percentage display area, a higher resolution can be displayed.

Figure 8C:
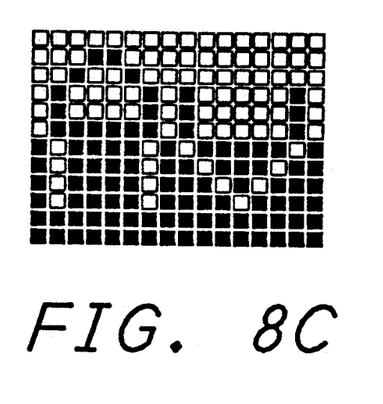
Figure 8D:
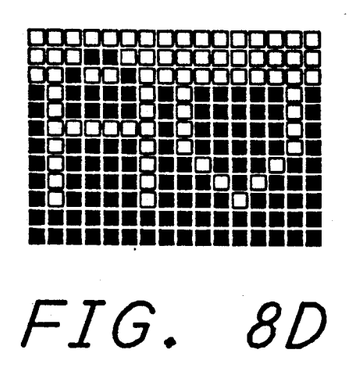
Figure 8E:
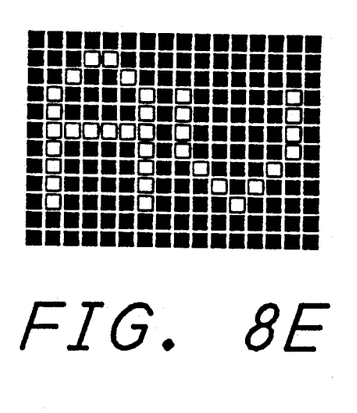

FIG. 8C shows the percentage display area after approximately 50% of the acquisitions have been taken, and FIG. 8D shows the percentage display area after approximately 75% of the acquisitions have been taken. FIG. 8E shows the percentage display area after 100% of the target number of acquisitions have been taken. Note that the intensity of the dots is reversed from the intensity displayed in FIG. 8A.

The percentage display area may be indicated in one of several forms. In a first form, the dots of the characters or symbols within the percentage display area are made of dark dots on a light background, and inverted to light dots on a dark background to indicate 100% completion. This could also be done on a typical CRT screen by having normal intensity dots to represent the character at 0% completion, and intensified dots represent 100% completion. Yet another method would be to represent the display of FIG. 8A by forming the character from high intensity dots on a background of low intensity dots and reversing the intensity of these dots to achieve FIG. 8E. Still another variation would be to form the symbols within the display of FIG. 8A with dots having one color on a background of a second color. For example, red dots could be used to form the letters of the characters "AV", on a background of blue dots. The colors could then be reversed to form the display of FIG. 8E.

Having thus described a presently preferred embodiment of the present invention, it will now be appreciated that the aspects of the invention have been fully achieved, and it will be understood by those skilled in the art that many changes in construction and widely differing embodiments and applications of the invention will suggest themselves without departing from the spirit and scope of the present invention. The disclosures and the description herein are intended to be illustrative and are not in any sense limiting of the invention, more preferably defined in scope by the following claims.

What is claimed is:

1. A method for displaying, in an electronic instrument having a display element, a percentage of a predefined type of operations being performed, said method comprising the steps of:
   (a) identifying a portion of said display of said electronic instrument as a percentage display area, wherein said portion comprises a matrix of dots containing a symbol displayed as a series of dots;
   (b) dividing a number of said type of operations performed by a target number of said type of operations to be performed to create a progress ratio;
   (c) multiplying said progress ratio by a size of said percentage display area to create a ratio display line location within said percentage display area of said electronic instrument, wherein said ratio display line separates said percentage display areas at a location representative of said progress ratio;
   (d) displaying information in said percentage display area along and on a first side of said ratio display line location in a first format comprising displaying said dots of said symbol in a first color on a background of a second color;
   (e) displaying information in said percentage display area on a second side, opposite said first side, of said ratio display line location in a second format comprising displaying said dots of said symbol in said second color on a background of said first color.

2. The method of claim 1 wherein step (a) further comprises the step of defining said percentage display area as a matrix of dots.

3. The method of claim 2 wherein step (e) further comprises the step of defining said second format as displaying each of said dots in a color different from a color of said first format.

4. The method of claim 2 wherein step (e) further comprises the step of defining said second format as displaying each of said dots in an intensity level different from an intensity level of said first format.

5. The method of claim 1 wherein step (a) further comprises the step of defining said percentage display area as a matrix of dots containing a symbol displayed as a series of dots.

6. The method of claim 5 wherein step (d) further comprises the step of defining said first format as displaying said dots of said symbol in a first color on a background of a second color and wherein step (e) further comprises the step of defining said second format as displaying each of said dots of said symbol in said second color on a background of said first color.

7. A method for displaying, in an electronic instrument having a display element, a percentage of operations performed, said method comprising the steps of:
(a) identifying a plurality of portions of said display of said electronic instrument as a plurality of percentage display areas, each of equal size, wherein each of said portions comprises a matrix of dots containing a symbol displayed as a series of dots;
(b) dividing a number of operations performed by a target number of operations to be performed to create a progress ratio;
(c) multiplying said progress ratio by the size of said percentage display area to create a ratio display line location within each of said percentage display areas of said electronic instrument, wherein said ratio display line separates each of said percentage display areas at a location representative of said progress ratio;
(d) displaying information in each of said percentage display areas on a first side of said ratio display line location in a first format comprising displaying said dots of said symbol in a first color on a background of a second color;
(e) displaying information in each of said percentage display areas on a second side, opposite said first side, of said ratio display line location in a second format comprising displaying said dots of said symbol in said second color on a background of said first color; and
(f) integer dividing said progress ratio by a number of said plurality of percentage display areas to create a progress remainder; and
(g) displaying information along said ratio display line in each of said percentage display areas having a number less than or equal to said progress remainder in said first format; and
(h) displaying information along said ratio display line in each of said percentage display areas having a number greater than said progress remainder in said second format.

8. The method of claim 7 wherein step (a) further comprises the step of defining each of said percentage display areas as a matrix of dots.

9. The method of claim 8 wherein steps (e) and (h) further comprise the steps of defining said second format as displaying each of said dots in a color different from a color of said first format.

10. The method of claim 8 wherein steps (e) and (h) further comprise the steps of defining said second format as displaying each of said dots in an intensity level different from an intensity level of said first format.

11. The method of claim 7 wherein step (a) further comprises the step of defining each of said percentage display areas as a matrix of dots containing a symbol displayed as a series of dots.

12. The method of claim 11 wherein steps (d) and (g) further comprise the steps of defining said first format as displaying said dots of said symbol in a first color on a background of a second color and wherein steps (e) and (h) further comprise the steps of defining said second format as displaying each of said dots of said symbol in said second color on a background of said first color.

* * * * *